United States Patent
Fujita et al.

(10) Patent No.: US 6,819,281 B2
(45) Date of Patent: Nov. 16, 2004

(54) A/D CONVERSION CIRCUIT AND SOLID IMAGING DEVICE

(75) Inventors: Kazuki Fujita, Hamamatsu (JP); Seiichiro Mizuno, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/469,034

(22) PCT Filed: Feb. 26, 2002

(86) PCT No.: PCT/JP02/01746
§ 371 (c)(1),
(2), (4) Date: Aug. 26, 2003

(87) PCT Pub. No.: WO02/073808
PCT Pub. Date: Sep. 19, 2002

(65) Prior Publication Data
US 2004/0070531 A1 Apr. 15, 2004

(30) Foreign Application Priority Data
Feb. 27, 2001 (JP) ........................ 2001-052693

(51) Int. Cl.[7] ............................................. H03M 1/12
(52) U.S. Cl. .................. 341/172; 341/166; 341/143; 341/158
(58) Field of Search .............................. 341/172, 166, 341/156, 143

(56) References Cited

U.S. PATENT DOCUMENTS

| | | | | |
|---|---|---|---|---|
| 4,667,179 A | | 5/1987 | Law et al. ................ | 340/347 |
| 4,764,753 A | * | 8/1988 | Yukawa .................... | 341/172 |
| 5,030,954 A | * | 7/1991 | Ribner .................... | 341/172 |
| 5,500,645 A | * | 3/1996 | Ribner et al. ............ | 341/143 |
| 6,184,811 B1 | * | 2/2001 | Nagari et al. ............ | 341/172 |
| 6,208,282 B1 | * | 3/2001 | Miyamoto ................ | 341/172 |

FOREIGN PATENT DOCUMENTS

| JP | 61-256824 | 11/1986 |
|---|---|---|
| JP | 05-175464 | 3/1993 |
| JP | 2000-32342 | 1/2000 |

\* cited by examiner

*Primary Examiner*—Michael Tokar
*Assistant Examiner*—Lam T. Mai
(74) *Attorney, Agent, or Firm*—Morgan, Lewis & Bockius LLP

(57) ABSTRACT

An A/D conversion circuit 20 comprises a coupling capacitor $C_{201}$, feedback capacitor $C_{202}$, switch $SW_{202}$, amplifier 201, comparison portion 202, capacitance control portion 203, and variable capacitance portions 210, 220, and 230. The variable capacitance portion 210 comprises capacitors $C_{211}$ to $C_{214}$ and switches $SW_{211}$ to $SW_{214}$. One end of each of the capacitors $C_{211}$ to $C_{214}$ is connected to the inverted input terminal of the amplifier 201, and the other end is connected, via the respective switches $SW_{211}$ to $SW_{214}$, to either the reference voltage $V_{ref1}$ or to the common voltage $V_{com}$.

4 Claims, 8 Drawing Sheets

Fig.4

| Vin | D11 | D10 | D9 | D8 |
|---|---|---|---|---|
| 15Vref 1/16 ~ Vref 1 | 1 | 1 | 1 | 1 |
| 14Vref 1/16 ~ 15Vref 1/16 | 1 | 1 | 1 | 0 |
| 13Vref 1/16 ~ 14Vref 1/16 | 1 | 1 | 0 | 1 |
| 12Vref 1/16 ~ 13Vref 1/16 | 1 | 1 | 0 | 0 |
| 11Vref 1/16 ~ 12Vref 1/16 | 1 | 0 | 1 | 1 |
| 10Vref 1/16 ~ 11Vref 1/16 | 1 | 0 | 1 | 0 |
| 9Vref 1/16 ~ 10Vref 1/16 | 1 | 0 | 0 | 1 |
| 8Vref 1/16 ~ 9Vref 1/16 | 1 | 0 | 0 | 0 |
| 7Vref 1/16 ~ 8Vref 1/16 | 0 | 1 | 1 | 1 |
| 6Vref 1/16 ~ 7Vref 1/16 | 0 | 1 | 1 | 0 |
| 5Vref 1/16 ~ 6Vref 1/16 | 0 | 1 | 0 | 1 |
| 4Vref 1/16 ~ 5Vref 1/16 | 0 | 1 | 0 | 0 |
| 3Vref 1/16 ~ 4Vref 1/16 | 0 | 0 | 1 | 1 |
| 2Vref 1/16 ~ 3Vref 1/16 | 0 | 0 | 1 | 0 |
| Vref 1/16 ~ 2Vref 1/16 | 0 | 0 | 0 | 1 |
| 0 ~ Vref 1/16 | 0 | 0 | 0 | 0 |

Fig.5

| V1 | D7 | D6 | D5 | D4 |
|---|---|---|---|---|
| 15Vref 2/16 ~ Vref 2 | 1 | 1 | 1 | 1 |
| 14Vref 2/16 ~ 15Vref 2/16 | 1 | 1 | 1 | 0 |
| 13Vref 2/16 ~ 14Vref 2/16 | 1 | 1 | 0 | 1 |
| 12Vref 2/16 ~ 13Vref 2/16 | 1 | 1 | 0 | 0 |
| 11Vref 2/16 ~ 12Vref 2/16 | 1 | 0 | 1 | 1 |
| 10Vref 2/16 ~ 11Vref 2/16 | 1 | 0 | 1 | 0 |
| 9Vref 2/16 ~ 10Vref 2/16 | 1 | 0 | 0 | 1 |
| 8Vref 2/16 ~ 9Vref 2/16 | 1 | 0 | 0 | 0 |
| 7Vref 2/16 ~ 8Vref 2/16 | 0 | 1 | 1 | 1 |
| 6Vref 2/16 ~ 7Vref 2/16 | 0 | 1 | 1 | 0 |
| 5Vref 2/16 ~ 6Vref 2/16 | 0 | 1 | 0 | 1 |
| 4Vref 2/16 ~ 5Vref 2/16 | 0 | 1 | 0 | 0 |
| 3Vref 2/16 ~ 4Vref 2/16 | 0 | 0 | 1 | 1 |
| 2Vref 2/16 ~ 3Vref 2/16 | 0 | 0 | 1 | 0 |
| Vref 2/16 ~ 2Vref 2/16 | 0 | 0 | 0 | 1 |
| 0 ~ Vref 2/16 | 0 | 0 | 0 | 0 |

Fig.6

| V2 | D3 | D2 | D1 | D0 |
|---|---|---|---|---|
| 15Vref 3/16 ~ Vref 3 | 1 | 1 | 1 | 1 |
| 14Vref 3/16 ~ 15Vref 3/16 | 1 | 1 | 1 | 0 |
| 13Vref 3/16 ~ 14Vref 3/16 | 1 | 1 | 0 | 1 |
| 12Vref 3/16 ~ 13Vref 3/16 | 1 | 1 | 0 | 0 |
| 11Vref 3/16 ~ 12Vref 3/16 | 1 | 0 | 1 | 1 |
| 10Vref 3/16 ~ 11Vref 3/16 | 1 | 0 | 1 | 0 |
| 9Vref 3/16 ~ 10Vref 3/16 | 1 | 0 | 0 | 1 |
| 8Vref 3/16 ~ 9Vref 3/16 | 1 | 0 | 0 | 0 |
| 7Vref 3/16 ~ 8Vref 3/16 | 0 | 1 | 1 | 1 |
| 6Vref 3/16 ~ 7Vref 3/16 | 0 | 1 | 1 | 0 |
| 5Vref 3/16 ~ 6Vref 3/16 | 0 | 1 | 0 | 1 |
| 4Vref 3/16 ~ 5Vref 3/16 | 0 | 1 | 0 | 0 |
| 3Vref 3/16 ~ 4Vref 3/16 | 0 | 0 | 1 | 1 |
| 2Vref 3/16 ~ 3Vref 3/16 | 0 | 0 | 1 | 0 |
| Vref 3/16 ~ 2Vref 3/16 | 0 | 0 | 0 | 1 |
| 0 ~ Vref 3/16 | 0 | 0 | 0 | 0 |

US 6,819,281 B2

A/D CONVERSION CIRCUIT AND SOLID IMAGING DEVICE

TECHNICAL FIELD

This invention relates to an A/D conversion circuit which converts analog values into digital values, and a solid-state image pickup device comprising an A/D conversion circuit.

BACKGROUND ART

A solid-state image pickup device comprises a plurality of photodetector elements, arranged in a one-dimensional or two-dimensional array, and a plurality of integrating circuits which integrate the signal currents output from each photodetector element to convert the signal currents into voltages. In this solid-state image pickup device, signal currents with values corresponding to the incident light intensity are output from the plurality of photodetector elements, voltages corresponding to the integrated signal currents are output from the integrating circuits, and based on the voltages, the distribution of the incident light intensity is obtained, to capture an image. A solid-state image pickup device may further comprise an A/D conversion circuit to convert voltages (analog values) output from the integrating circuits into digital values. In this case, an incident light intensity is obtained as a digital value, and image processing by a computer or similar becomes possible.

One well-known configuration of an A/D conversion circuit comprises N combinations of capacitors and switches; of the N capacitors, the nth capacitor has a capacitance value of $2^{n-1}$ ($N \geq 2$, $1 \leq n \leq N$). In this A/D conversion circuit, all capacitance values are set appropriately by appropriately setting the open/close states of each of the N switches according to the input analog value, so that an N-bit digital value corresponding to the open/close states of the N switches is output.

In such a solid-state image pickup device, faster operation and higher precision of the A/D conversion circuit are sought. In order to achieve faster operation, A/D conversion circuits are provided for each integrating circuit, to perform parallel processing. In order to increase precision, the number of bits of the digital value output from A/D conversion circuits is increased. Hence in order to improve both the processing speed and the precision of A/D conversion processing, an A/D conversion circuit may be provided for each integrating circuit to perform parallel processing, and the number of capacitors N in each A/D conversion circuit may be increased.

DISCLOSURE OF THE INVENTION

However, when attempting to fabricate a solid-state image pickup device comprising an A/D conversion circuit as described above on a single semiconductor chip, the following problems are encountered. The area occupied by capacitors on the chip is substantially proportional to the capacitance value. Hence if the number of bits is N, then the area occupied by N capacitors of an A/D conversion circuit is equivalent to the area occupied by one capacitor with capacitance value $2^N C$ ($\approx C + 2C + 2^2 C + \ldots + 2^{N-1} C$). That is, if the number of bits is increased by one, the area occupied by all the capacitors of the A/D conversion circuit increases by a factor of 2. Also, if the capacitance value of a capacitor is large, the parasitic capacitance also increases, and fast A/D conversion processing becomes impossible. Hence conventional solid-state image pickup devices comprising A/D conversion circuits encounter limits in attempting to improve both speed, by providing an integrating circuit for each A/D conversion circuit, and precision, by increasing the number of bits of the digital values output from A/D conversion circuits.

The present invention was devised in order to resolve the above problems, and it is an object of the invention to provide an A/D conversion circuit which, while occupying a small area, easily achieves both fast operation and high precision, as well as a solid-state image pickup device comprising this A/D conversion circuit.

An A/D conversion circuit of this invention converts an analog value input to an input end into a digital value and outputs this digital value from an output end, and is characterized in comprising: (1) an amplifier, having a first input terminal, a second input terminal and an output terminal, in which the first input terminal is connected to the input end via a coupling capacitor, and a common voltage $V_{com}$ is input to the second input terminal; (2) a feedback capacitor, provided between the first input terminal and the output terminal of the amplifier; (3) a switch, provided between the first input terminal and the output terminal of the amplifier; (4) a number M of variable-capacitance portions, each having a number $N_m$ of capacitors with different capacitance values, one end of each of which is connected to the first input terminal of the amplifier, and voltage switching means to switch the voltage input to each of the other ends of the $N_m$ capacitors to a common voltage $V_{com}$ and to $P_m$ reference voltages $V_{ref,m,1}$ to $V_{ref,m,Pm}$ ($M \geq 1$, $N_m \geq 1$, $P_m \geq 1$, $1 \leq m \leq M$, but excluding the case $M = P_1 = 1$); (5) a comparison portion, which compares the magnitudes of the voltage output from the amplifier output terminal and the common voltage $V_{com}$, and outputs a signal indicating the comparison result; and, (6) a capacitance control portion, which controls the switching operation in each of the voltage switching means of the M variable-capacitance portions, and which outputs a digital value to the output terminal based on the switched state in the respective voltage switching means of the M variable-capacitance portions as well as the signal output from the comparison portion.

By means of this A/D conversion circuit, when the switch between the first input terminal and the output terminal of the amplifier is closed, the feedback capacitor between the first input terminal and the output terminal of the amplifier is discharged. When the switch is then opened and a voltage (analog value) for A/D conversion is input from the input end, electric charge corresponding to the input voltage integrates across the feedback capacitor. Then, either the common voltage $V_{com}$ or one of the $P_m$ reference voltages $V_{ref,m,1}$ to $V_{ref,m,Pm}$ is switched by the voltage switching means to each of the other ends of the $N_m$ capacitors comprised by each of the M variable capacitance portions controlled by the capacitance control portion. One end of the $N_m$ capacitors comprised by each of the M variable capacitance portions is connected to the first input terminal of the amplifier, either directly or via a switch, so that upon switching, charge moves from the feedback capacitor to the M variable capacitance portions. Then, a voltage corresponding to the amount of charge remaining in the feedback capacitor is output from the output terminal of the amplifier. The magnitude of the voltage output from the amplifier is compared with the common voltage $V_{com}$ by the comparison portion, and a signal indicating the comparison result is output from the comparison portion to the capacitance control portion. Based on the switching states of the voltage switching means in each of the M variable capacitance portions and the signal output from the comparison portion, a digital value is output from the capacitance control portion to the output end.

In an A/D conversion circuit of this invention, it is preferable that M be 1, and that $N_1$ and $P_1$ be pluralities. In this case, the area occupied on the chip by the $N_m$ capacitors comprised by each of the M variable capacitance portions is further reduced. In an A/D conversion circuit of this invention, it is preferable that M and $N_1$ each be 1, and that $P_1$ be a plurality; in this case, even compared with the above-described case, the area occupied on the chip by the $N_m$ capacitors comprised by each of the M variable capacitance portions is further reduced.

A solid-state image pickup device of this invention is characterized in comprising (1) a photodetector element which outputs a signal current according to the incident light intensity; (2) an integrating circuit which inputs and integrates the signal current output from the photodetector element, and outputs a voltage corresponding to the integrated value of the signal current; and, (3) an A/D conversion circuit of this invention as described above, which inputs the voltage output from the integrating circuit, and converts this voltage into a digital value.

By means of this solid-state image pickup device, a signal current corresponding to the incident light intensity is output from the photodetector element, this signal current is input to and integrated by the integrating circuit, and a voltage corresponding to the integrated value is output from the integrating circuit. The voltage output from the integrating circuit is converted into a digital value by an A/D conversion circuit of this invention, described above.

BRIEF DESCRIPTION OF THE DRAWINGS

FIG. 4 is a table indicating the relation between the voltage $V_{in}$ input to the A/D conversion circuit 20 and the values of the four bits $D_{11}$ to $D_8$;

FIG. 5 is a table indicating the relation between the voltage $V_1$ and the values of the four bits $D_7$ to $D_4$;

FIG. 6 is a table indicating the relation between the voltage $V_2$ and the values of the four bits $D_3$ to $D_0$;

BEST MODES FOR CARRYING OUT THE INVENTION

Below, embodiments of this invention are explained in detail, referring to the attached drawings. In explanations of the drawings, the same components are assigned the same symbols, and redundant explanations are omitted.

(First Embodiment)

Figure 1:
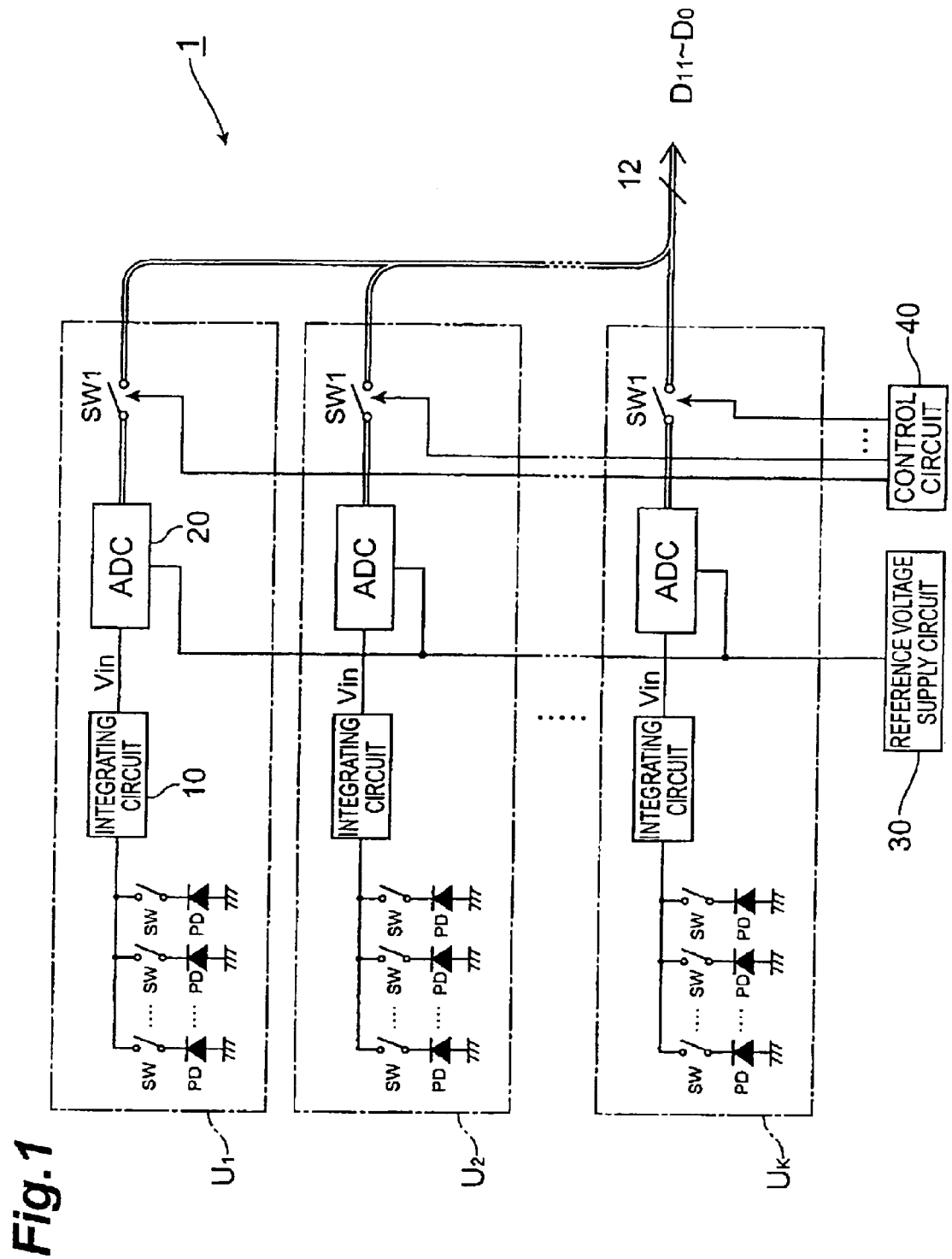
FIG. 1 is a drawing of the configuration of a solid-state image pickup device 1 comprising an A/D conversion circuit 20 of a first embodiment.

The first embodiment of the invention is explained. FIG. 1 is a drawing of the configuration of a solid-state image pickup device 1 comprising an A/D conversion circuit 20 of the first embodiment. This solid-state image pickup device 1 comprises K units $U_1$ to $U_K$ (where K is an integer equal to or greater than 1); each unit $U_K$ (where k is an arbitrary integer greater than or equal to 1, and less than or equal to K) has a plurality of combinations of photodiodes (photodetector elements) PD and switches SW, an integrating circuit 10, an A/D conversion circuit 20, and a switch SW1. The solid-state image pickup device I comprises a reference voltage supply circuit 30 and control circuit 40.

In each unit $U_k$, each photodiode PD is grounded at the anode, while the cathode is connected to the input end of the integrating circuit 10 via the switch SW; a signal current corresponding to the incident light intensity is output to the integrating circuit 10. The integrating circuit 10 inputs and integrates the signal current output from the photodiode PD, and outputs a voltage corresponding to the integrated value of this signal current. The A/D conversion circuit 20 inputs the voltage output from the integrating circuit 10, converts this voltage (analog value) into a 12-bit digital value ($D_{11}$ through $D_0$), and outputs this digital value to the switch SW1.

The reference voltage supply circuit 30 supplies a reference voltage to the A/D conversion circuits 20 of each of the units $U_k$. The control circuit 40 controls the opening and closing of the switches SW provided between each photodiode PD and integrating circuit 10, and is connected in succession to each photodiode PD and integrating circuit 10. The control circuit 40 controls the opening and closing of the switches SW1 provided after the A/D conversion circuits 20, and outputs digital values in succession to each unit $U_k$. The control circuit 40 controls the opening and closing of the respective switches comprised by the integrating circuits 10 and switches comprised by the A/D conversion circuits 20, to cause the desired operation to occur.

Figure 2:
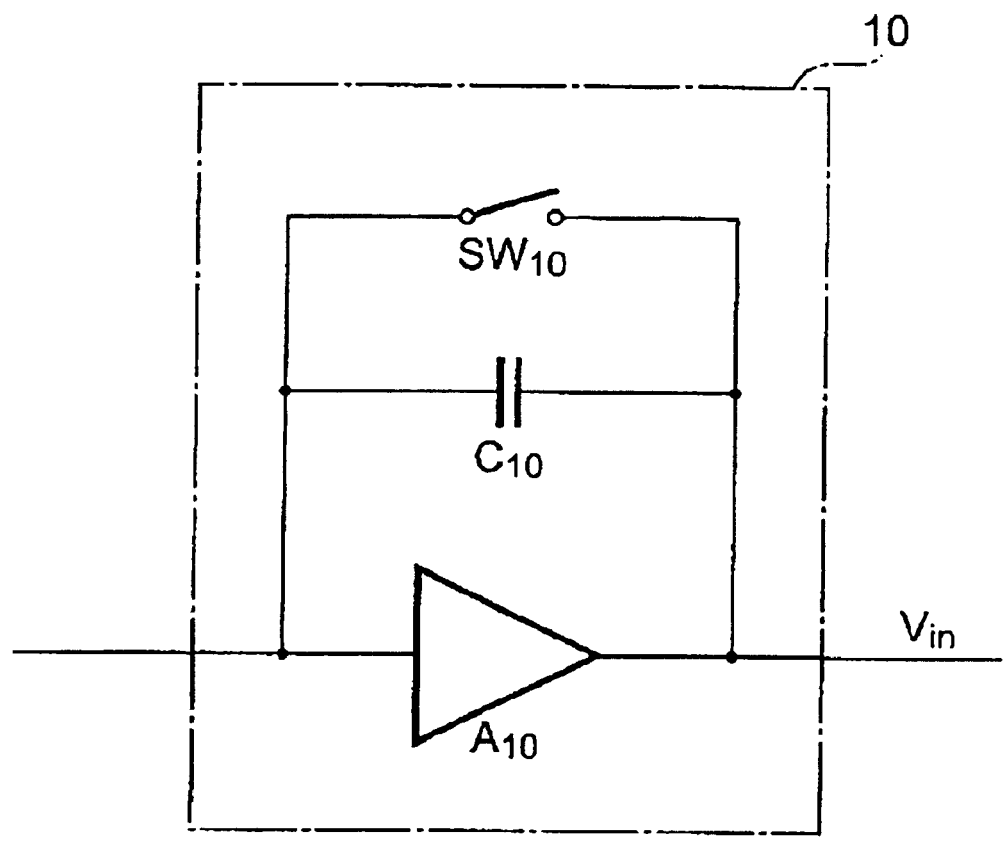
FIG. 2 is a circuit diagram of the integrating circuit 10.

FIG. 2 is a circuit diagram of an integrating circuit 10. In the integrating circuit 10, an amplifier $A_{10}$, capacitor $C_{10}$ and switch $SW_{10}$ are provided in parallel between the input end and output end. The capacitor $C_{10}$ is provided between the input terminal and the output terminal of the amplifier $A_{10}$, and when the switch $SW_{10}$ is open integrates the signal current, that is, electric charge, input to the input end. The switch $SW_{10}$ is provided between the input terminal and the output terminal of the amplifier $A_{10}$, and when open causes charge to integrate in the capacitor $C_{10}$, but when closed resets the integration of charge in the capacitor $C_{10}$.

Figure 3:
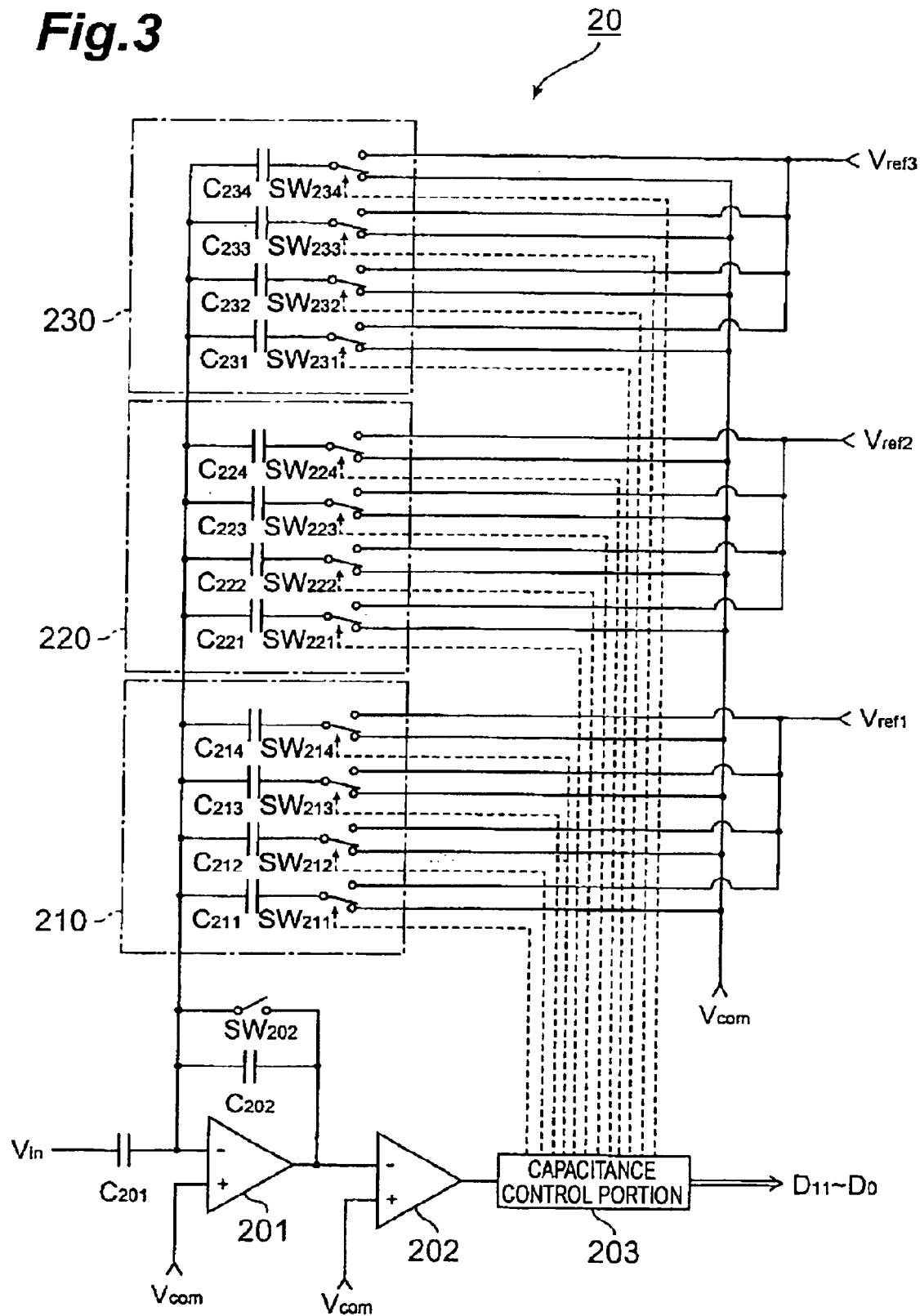
FIG. 3 is a circuit diagram of the A/D conversion circuit 20 of the first embodiment.

FIG. 3 is a circuit diagram of the A/D conversion circuit 20 of the first embodiment. This A/D conversion circuit 20 comprises a coupling capacitor $C_{201}$, feedback capacitor $C_{202}$, switch $SW_{202}$, amplifier 201, comparison portion 202, capacitance control portion 203, and variable capacitance portions 210, 220 and 230.

The amplifier 201 inputs the voltage (analog value) output from the integrating circuit 10 to the inverted input terminal via the coupling capacitor $C_{201}$, and inputs the common voltage $V_{com}$ to the non-inverted input terminal. The feedback capacitor $C_{202}$ is provided between the inverted input terminal and output terminal of the amplifier 201, and integrates charge according to the input voltage. The switch $SW_{202}$ is provided between the inverted input terminal and the output terminal of the amplifier 201, and when open causes charge to integrate in the feedback capacitor $C_{202}$, but when closed resets the charge integration in the feedback capacitor $C_{202}$. The amplifier 201 outputs, from the output terminal to the comparison portion 202, a voltage corresponding to the charge amount integrated in the feedback capacitor $C_{202}$. The comparison circuit 202 inputs the voltage output from the amplifier 201 to the inverted input terminal, inputs the common voltage $V_{com}$ to the non-inverted input terminal, compares the magnitudes of the two input signals, and outputs a signal indicating the comparison result to the capacitance control portion 203.

The variable capacitance portion 210 comprises four capacitors $C_{211}$ to $C_{214}$ and four switches $SW_{211}$ to $SW_{214}$ (voltage switching means). One end of the capacitor $C_{211}$ is connected to the inverted input terminal of the amplifier 201, and the other end is connected, via the switch $SW_{211}$, to either the reference voltage $V_{ref1}$ or to the common voltage $V_{com}$. One end of the capacitor $C_{212}$ is connected to the inverted input terminal of the amplifier 201, and the other end is connected, via the switch $SW_{212}$, to either the reference voltage $V_{ref1}$ or to the common voltage $V_{com}$. One end of the capacitor $C_{213}$ is connected to the inverted input terminal of the amplifier 201, and the other end is connected, via the switch $SW_{213}$, to either the reference voltage $V_{ref1}$ or to the common voltage $V_{com}$. And, one end of the capacitor $C_{214}$ is connected to the inverted input terminal of the amplifier 201, and the other end is connected, via the switch $SW_{214}$, to either the reference voltage $V_{ref1}$ or to the common voltage $V_{com}$.

The variable capacitance portion 220 comprises four capacitors $C_{221}$ to $C_{224}$ and four switches $SW_{221}$ to $SW_{224}$ (voltage switching means). One end of the capacitor $C_{221}$ is connected to the inverted input terminal of the amplifier 201, and the other end is connected, via the switch $SW_{221}$, to either the reference voltage $V_{ref2}$ or to the common voltage $V_{com}$. One end of the capacitor $C_{222}$ is connected to the inverted input terminal of the amplifier 201, and the other end is connected, via the switch $SW_{222}$, to either the reference voltage $V_{ref2}$ or to the common voltage $V_{com}$ one end of the capacitor $C_{223}$ is connected to the inverted input terminal of the amplifier 201, and the other end is connected, via the switch $SW_{223}$, to either the reference voltage $V_{ref2}$ or to the common voltage $V_{com}$. And, one end of the capacitor $C_{224}$ is connected to the inverted input terminal of the amplifier 201, and the other end is connected, via the switch $SW_{224}$, to either the reference voltage $V_{ref2}$ or to the common voltage $V_{com}$.

The variable capacitance portion 230 comprises four capacitors $C_{231}$ to $C_{234}$ and four switches $SW_{231}$ to $SW_{234}$ (voltage switching means). One end of the capacitor $C_{231}$ is connected to the inverted input terminal of the amplifier 201, and the other end is connected, via the switch $SW_{231}$, to either the reference voltage $V_{ref3}$ or to the common voltage $V_{com}$. One end of the capacitor $C_{232}$ is connected to the inverted input terminal of the amplifier 201, and the other end is connected, via the switch $SW_{232}$, to either the reference voltage $V_{ref3}$ or to the common voltage $V_{com}$. One end of the capacitor $C_{233}$ is connected to the inverted input terminal of the amplifier 201, and the other end is connected, via the switch $SW_{233}$, to either the reference voltage $V_{ref3}$ or to the common voltage $V_{com}$. And, one end of the capacitor $C_{234}$ is connected to the inverted input terminal of the amplifier 201, and the other end is connected, via the switch $SW_{234}$, to either the reference voltage $V_{ref3}$ or to the common voltage $V_{com}$.

The capacitance values of the capacitors, coupling capacitors $C_{201}$, and feedback capacitors $C_{202}$ comprised by each of the variable capacitance portions 210, 220 and 230 satisfy the following relations.

$$C_{201} = C_{202} = 16C \tag{1a}$$

$$C_{211} = C_{221} = C_{231} = 8C \tag{1b}$$

$$C_{212} = C_{222} = C_{232} = 4C \tag{1c}$$

$$C_{213} = C_{223} = C_{233} = 2C \tag{1d}$$

$$C_{214} = C_{224} = C_{234} = C \tag{1e}$$

Here C is a certain constant capacitance value. The reference voltage $V_{ref1}$ supplied to the variable capacitance portion 210, the reference voltage $V_{ref2}$ supplied to the variable capacitance portion 220, the reference voltage $V_{ref3}$ supplied to the variable capacitance portion 230, and the common voltage $V_{com}$ satisfy the following relations.

$$V_{ref2} - V_{com} = (V_{ref1} - V_{com})/16 \tag{2a}$$

$$V_{ref3} - V_{com} = (V_{ref2} - V_{com})/16 \tag{2b}$$

Because the common voltage $V_{com}$ is generally taken to be ground potential, hereafter it is assumed that $V_{com} = 0$. Then, the above equations (2a), (2b) are expressed as follows.

$$V_{ref2} = V_{ref1}/16 \tag{3a}$$

$$V_{ref3} = V_{ref2}/16 \tag{3b}$$

Each of these reference voltages $V_{ref1}$, $V_{ref2}$ and $V_{ref3}$ is supplied by the reference voltage supply circuit 30. The reference voltage supply circuit 30 is, for example, a voltage-dividing circuit in which resistors are connected in series.

The capacitance control portion 203 controls switching operation of the switch elements $SW_{211}$ to $SW_{214}$, $SW_{221}$ to $SW_{224}$, and $SW_{231}$ to $SW_{234}$. The capacitance control portion 203 stores the switched states of each of these 12 switches, and based on these switched states and on the signal output from the comparison portion 202, outputs a 12-bit digital value ($D_{11}$ to $D_0$). That is, the uppermost bit $D_{11}$ of the digital value output from the capacitance control portion 203 corresponds to the switched state of the switch $SW_{211}$; the bit $D_{10}$ corresponds to the switched state of the switch $SW_{212}$; the bit $D_9$ corresponds to the switched state of the switch $SW_{213}$; the bit $D_8$ corresponds to the switched state of the switch $SW_{214}$; the bit $D_7$ corresponds to the switched state of the switch $SW_{221}$; the bit $D_6$ corresponds to the switched state of the switch $SW_{222}$; the bit $D_5$ corresponds to the switched state of the switch $SW_{223}$; the bit $D_4$ corresponds to the switched state of the switch $SW_{224}$; the bit $D_3$ corresponds to the switched state of the switch $SW_{231}$; the bit $D_2$ corresponds to the switched state of the switch $SW_{232}$; the bit $D_1$ corresponds to the switched state of the switch $SW_{233}$; and, the lowermost bit $D_0$ corresponds to the switched state of the switch $SW_{234}$.

Next, operation of the solid-state image pickup device 1 and A/D conversion circuit 20 of the first embodiment is explained. In each unit $U_k$, the signal current output from a photodiode PD is input to the integrating circuit 10 via a switch SW, and by integrating charge in the capacitor $C_{10}$ of this integrating circuit 10, a voltage corresponding to the input signal current is output. The voltage $V_{in}$, output from the integrating circuit 10 is input to the A/D conversion circuit 20. In this A/D conversion circuit 20, the voltage $V_{in}$ is converted into a digital value ($D_{11}$ to $D_0$). Up to this point, the units $U_k$ operate in parallel. Then the switches SW1 of each unit $U_k$ close in succession, and the digital values output from the A/D conversion circuit 20 of each unit $U_k$ are output in succession from each unit $U_k$.

The A/D conversion circuit 20 of each unit $U_k$ operates as follows. In the first stage of the A/D conversion processing, the switch $SW_{202}$ is closed, and the feedback capacitor $C_{202}$ is discharging. Further, each of the switches $SW_{211}$ to $SW_{214}$, $SW_{221}$ to $SW_{224}$, and $SW_{231}$ to $SW_{234}$ is switched to the side of the common voltage $V_{com}$. Then, the switch $SW_{202}$ is opened, and a charge amount Q corresponding to the voltage $V_{in}$ output from the integrating circuit 10 is integrated in the feedback capacitor $C_{202}$. The charge amount Q is then expressed by the following equation.

$$Q = C_{202} \cdot V_{in} = 16C \cdot V_{in} \tag{4}$$

Thereafter, actual A/D conversion processing is initiated.

In the second stage of A/D conversion processing, switching of the four switches $SW_{211}$ to $SW_{214}$ comprised by the variable capacitance portion 210 is performed. First, the switch $SW_{211}$ corresponding to the capacitor $C_{211}$ having the largest capacitance value among the four capacitors $C_{211}$ to $C_{214}$ is switched to the reference voltage $V_{ref1}$. As a result, the charge amount $Q_{211}$, which is a part of the charge Q integrated in the feedback capacitor $C_{202}$ (eq. (4)), moves to the capacitor $C_{211}$, the charge amount $Q_{211}$ being expressed by the following equation:

$$Q_{211} = C_{211} \cdot V_{ref1} = 8C \cdot V_{ref1} \tag{5}$$

At this time, the charge amount $Q_{202}$ expressed by the following equation remains in the feedback capacitor $C_{202}$.

$$Q_{202} = 16C \cdot V_{in} - 8C \cdot V_{refl} \qquad (6)$$

$$= 16C(V_{in} - V_{refl}/2)$$

Also, the voltage $(V_{in}-V_{refl}/2)$ is output from the amplifier 201. The magnitudes of the voltage $(V_{in}-V_{refl}/2)$ input from the inverted input terminal of the amplifier 201 and the common voltage $V_{com}(=0)$ input from the non-inverted input terminal are compared by the comparison portion 202, and the sign of the voltage $(V_{in}-V_{refl}/2)$ is judged. The result is input to the capacitance control portion 203, and is stored as the value of the uppermost bit $D_{11}$ for output. That is, if the voltage $(V_{in}-V_{refl}/2)$ is positive, then $D_{11}$ is set to 1, and otherwise $D_{11}$ is set to 0.

If the voltage $(V_{in}-V_{refl}/2)$ is positive, the switch $SW_{212}$ corresponding to the capacitor $C_{212}$ with the next-largest capacitance is switched to the reference voltage $V_{refl}$. As a result, of the charge $Q_{202}$ which had been integrated in the feedback capacitor $C_{202}$ (eq. (6)), the charge amount $Q_{212}$ represented by the following equation moves to the capacitor $C_{212}$.

$$Q_{212} = C_{212} \cdot V_{refl} = 4C \cdot V_{refl} \qquad (7)$$

Also, at this time the charge amount $Q_{202}$ expressed by the following equation remains in the feedback capacitor $C_{202}$.

$$Q_{202} = 16C(V_{in} - V_{refl}/2) - 4C \cdot V_{refl} \qquad (8)$$

$$= 16C(V_{in} - 3V_{refl}/4)$$

Then, the voltage $(V_{in}-3V_{refl}/4)$ is output from the amplifier 201. The magnitudes of the voltage $(V_{in}-3V_{refl}/4)$ input from the amplifier 201 to the inverted input terminal and the common voltage $V_{com}$ (=0) input to the non-inverted input terminal are compared by the comparison portion 202, and the sign of the voltage $(V_{in}-3V_{refl}/4)$ is judged. The result is input to the capacitance control portion 203 and is stored as the value of the bit $D_{10}$ for output. That is, if the voltage $(V_{in}-3V_{refl}/4)$ is positive then $D_{10}$ is set to 1, and otherwise $D_{10}$ is set to 0.

If the voltage $(V_{in}-3V_{refl}/4)$ is positive, the switch $SW_{213}$ corresponding to the capacitor $C_{213}$ with the next-largest capacitance is switched to the reference voltage $V_{refl}$. As a result, of the charge $Q_{202}$ integrated in the feedback capacitor $C_{202}$ (eq. (8)), the charge amount $Q_{213}$ expressed by the following equation moves to the capacitor $C_{213}$.

$$Q_{213} = C_{213} \cdot V_{refl} = 2C \cdot V_{refl} \qquad (9)$$

At this time, the charge amount $Q_{202}$ expressed by the following equation remains in the feedback capacitor $C_{202}$.

$$Q_{202} = 16C(V_{in} - 3V_{refl}/4) - 2C \cdot V_{refl} \qquad (10)$$

$$= 16C(V_{in} - 7V_{refl}/8)$$

Then, the voltage $(V_{in}-7V_{refl}/8)$ is output from the amplifier 201. The magnitudes of the voltage $(V_{in}-7V_{refl}/8)$ input from the amplifier 201 to the inverted input terminal and the common voltage $V_{com}$ (=0) input to the non-inverted input terminal are compared by the comparison portion 202, and the sign of the voltage $(V_{in}-7V_{refl}/8)$ is judged. The result is input to the capacitance control portion 203 and is stored as the value of the bit $D_9$ for output. That is, if the voltage $(V_{in}-7V_{refl}/8)$ is positive then $D_9$ is set to 1, and otherwise $D_9$ is set to 0.

On the other hand, if in determining the value of the uppermost bit $D_{11}$ the voltage $(V_{in}-V_{refl}/2)$ is negative, the switch $SW_{211}$ returns to the common voltage $V_{com}$, and all of the charge amount Q (eq. (4)) returns to the feedback capacitor $C_{202}$. Then, the switch $SW_{212}$ corresponding to the capacitor $C212$ with the next-largest capacitance is switched to the reference voltage $V_{refl}$.

By this means, of the charge Q integrated in the feedback capacitor $C_{202}$ (eq. (4)), the charge amount $Q_{212}$ expressed by the following equation moves to the capacitor $C_{212}$.

$$Q_{212} = C_{212} \cdot V_{refl} = 4C \cdot V_{refl} \qquad (11)$$

At this time, the charge amount $Q_{202}$ expressed by the following equation remains in the feedback capacitor $C_{202}$.

$$Q_{202} = 16C \cdot V_{in} - 4C \cdot V_{refl} \qquad (12)$$

$$= 16C(V_{in} = V_{refl}/4)$$

Then, the voltage $(V_{in}-V_{refl}/4)$ is output from the amplifier 201. The magnitudes of the voltage $(V_{in}-V_{refl}/4)$ input to the inverted input terminal from the amplifier 201 and the common voltage $V_{com}$ (=0) input to the non-inverted input terminal are compared by the comparison portion 202, and the sign of the voltage $(V_{in}-V_{refl}/4)$ is judged. The result is input to the capacitance control portion 203, and is stored as the value of the bit $D_{10}$ for output. In other words, if the voltage $(V_{in}-V_{refl}/4)$ is positive then $D_{10}$ is set to 1, and otherwise $D_{10}$ is set to 0.

In this way, the switched states of the four switches $SW_{211}$ to $SW_{214}$ comprised by the variable capacitance portion 210 are determined in succession, and the values of the bits $D_{11}$ to $D_8$ are determined in succession.

FIG. 4 is a table showing the relations between the voltage $V_{in}$ input to the A/D conversion circuit 20 and the values of the four bits $D_{11}$ to $D_8$. At the time at which the values of these four bits $D_{11}$ to $D_8$ are determined, the charge amount $Q_1$ remaining in the feedback capacitor $C_{202}$ is equal to or less than $C \cdot V_{refl}$, and the voltage $V_1$ output from the amplifier 201 is $V_{refl}/2^4$ or less, which is a residue insufficient for A/D conversion in the above-described second stage.

In the third stage following the above-described second stage of A/D conversion processing, the charge amount $Q_1$ remaining in the feedback capacitor $C_{202}$ at the time the second-stage processing ends is subjected to processing similar to that of the second stage through switching operations of the four switches $SW_{221}$ to $SW_{224}$ comprised by the variable capacitance portion 220. That is, first the switch $SW_{221}$ corresponding to the capacitor $C_{221}$ with the largest capacitance among the four capacitors $C_{221}$ to $C_{224}$ is switched to the reference voltage $V_{ref2}$. As a result, of the charge $Q_1$ integrated in the feedback capacitor $C_{202}$, the charge amount $Q_{221}$ expressed by the following equation moves to the capacitor $C_{221}$.

$$Q_{221} = C_{221} \cdot V_{ref2} = 8C \cdot V_{ref2} \qquad (13)$$

At this time, the charge amount $Q_{202}$ expressed by the following equation remains in the feedback capacitor $C_{202}$.

$$Q_{202} = 16C \cdot V_1 - 8C \cdot V_{ref2} \qquad (14)$$

$$= 16C(V_1 - V_{ref2}/2)$$

Then, the voltage $(V_1-V_{ref2}/2)$ is output from the amplifier 201. The magnitudes of the voltage $(V_1-V_{ref2}/2)$ input to the inverted input terminal from the amplifier 201 and the common voltage $V_{com}$ (=0) input to the non-inverted input terminal are compared by the comparison portion 202, and the sign of the voltage ($V_1-V_{ref2}/2$) is judged. The result is input to the capacitance control portion 203, and is stored as the value of the bit $D_7$ for output. If the voltage ($V_2-V_{ref2}/2$) is positive then $D_7$ is set to 1, and otherwise $D_7$ is set to 0. That is, if the voltage ($V_1-V_{ref1}/32$) is positive then $D_7$ is set equal to 1, and otherwise $D_7$ is set equal to 0.

In subsequent processing similarly, the switched states of the four switches $SW_{221}$ to $SW_{224}$ comprised by the variable capacitance portion 220 are determined in succession, and the values of the bits $D_7$ to $D_4$ are determined in succession. FIG. 5 is a table showing the relations between the voltage $V_1$ and the values of the four bits $D_7$ to $D_4$. At the time at which the values of these four bits $D_7$ to $D_4$ are determined, the charge amount $Q_2$ remaining in the feedback capacitor $C_{202}$ is less than or equal to $C \cdot V_{ref2}$ (less than or equal to $C \cdot V_{ref1}/2^4$), and the voltage $V_2$ output from the amplifier 201 is less than or equal to $V_{ref2}/2^4$ (less than or equal to $V_{ref1}/2^8$), which is a residue insufficient for A/D conversion in the above-described third stage.

In the fourth stage following the above-described third stage of A/D conversion processing, the charge amount $Q_2$ remaining in the feedback capacitor $C_{202}$ at the time the third-stage processing ends is subjected to processing similar to that of the second stage through switching operations of the four switches $SW_{231}$ to $SW_{234}$ comprised by the variable capacitance portion 230. That is, first the switch $SW_{231}$ corresponding to the capacitor $C_{231}$ with the largest capacitance among the four capacitors $C_{231}$ to $C_{234}$ is switched to the reference voltage $V_{ref3}$. As a result, of the charge $Q_1$ integrated in the feedback capacitor $C_{202}$, the charge amount $Q_{231}$ expressed by the following equation moves to the capacitor $C_{231}$.

$$Q_{231} = C_{231} \cdot V_{ref3} = 8C \cdot V_{ref3} \quad (15)$$

At this time, the charge amount $Q_{202}$ expressed by the following equation remains in the feedback capacitor $C_{202}$.

$$Q_{202} = 16C \cdot V_2 - 8C \cdot V_{ref3} \quad (16)$$
$$= 16C(V_2 - V_{ref3}/2)$$

Then, the voltage ($V_2-V_{ref3}/2$) is output from the amplifier 201. The magnitudes of the voltage ($V_2-V_{ref3}/2$) input to the inverted input terminal from the amplifier 201 and the common voltage $V_{com}$ (=0) input to the non-inverted input terminal are compared by the comparison portion 202, and the sign of the voltage ($V_2-V_{ref3}/2$) is judged. The result is input to the capacitance control portion 203, and is stored as the value of the bit $D_3$ for output. If the voltage ($V_2-V_{ref3}/2$) is positive then $D_3$ is set to 1, and otherwise $D_3$ is set to 0. That is, if the voltage ($V_2-V_{ref1}/512$) is positive then $D_3$ is set equal to 1, and otherwise $D_3$ is set equal to 0.

In subsequent processing similarly, the switched states of the four switches $SW_{231}$ to $SW_{234}$ comprised by the variable capacitance portion 230 are determined in succession, and the values of the bits $D_3$ to $D_0$ are determined in succession. FIG. 6 is a table showing the relations between the voltage $V_2$ and the values of the four bits $D_3$ to $D_0$. At the time at which the values of these four bits $D_3$ to $D_0$ are determined, the charge amount $Q_3$ remaining in the feedback capacitor $C_{202}$ is less than or equal to $C \cdot V_{ref3}$ (less than or equal to $C \cdot V_{ref1}/2^8$), and the voltage $V_3$ output from the amplifier 201 is less than or equal to $V_{ref3}/2^4$ (less than or equal to $V_{ref1}/2^{12}$), which is a residue insufficient for A/D conversion even in the above-described fourth stage.

At the time the above-described fourth stage of A/D conversion processing ends, a 12-bit digital value $D_{11}$ to $D_0$ corresponding to the switched states of the 12 switches $SW_{211}$ to $SW_{214}$, $SW_{221}$ to $SW_{224}$, and $SW_{231}$ to $SW_{234}$ are stored in the capacitance control portion 203. After the fourth-stage processing ends, the 12 bits of digital values $D_{11}$ to $D_0$ are output from the capacitance control portion 203.

In this A/D conversion circuit 20, the area occupied on the chip by all of the capacitors and feedback capacitor portions $C_{202}$ comprised by the variable capacitance portions 210, 220 and 230 are equivalent to the area occupied by a capacitor with the capacitance value 61C (=3(8C+4C+2C+C)+16C). On the other hand, in a conventional A/D conversion circuit which outputs 12-bit digital values, the area occupied by the 12 capacitors is equivalent to the area occupied by one capacitor with a capacitance of $2^{12}C$. Thus the area occupied by capacitors in an A/D conversion circuit 20 of this invention is only 1/67 that of a device of the prior art.

Hence in the case of a solid-state image pickup device 1 comprising such an A/D conversion circuit 20 occupying a small area, the speed of operation can be increased by providing an A/D conversion circuit 20 for each integrating circuit 10, and the precision can be improved by increasing the number of bits of digital values output from the A/D conversion circuits 20. The resolution also can be improved by increasing the number of photodiodes PD. Further, whereas the maximum capacitance value in a conventional A/D conversion circuit is $2^{11}C$, the maximum capacitance value in an A/D conversion circuit 20 of this embodiment is 16C, so that there is little parasitic capacitance in an A/D conversion circuit 20 of this invention; for this reason also, the speed of A/D conversion processing can be increased.

(Second Embodiment)

Next, a second embodiment of the invention is explained. Compared with the case of the first embodiment, the solid-state image pickup device of the second embodiment differs in the configuration of the A/D conversion circuit 20.

Figure 7:
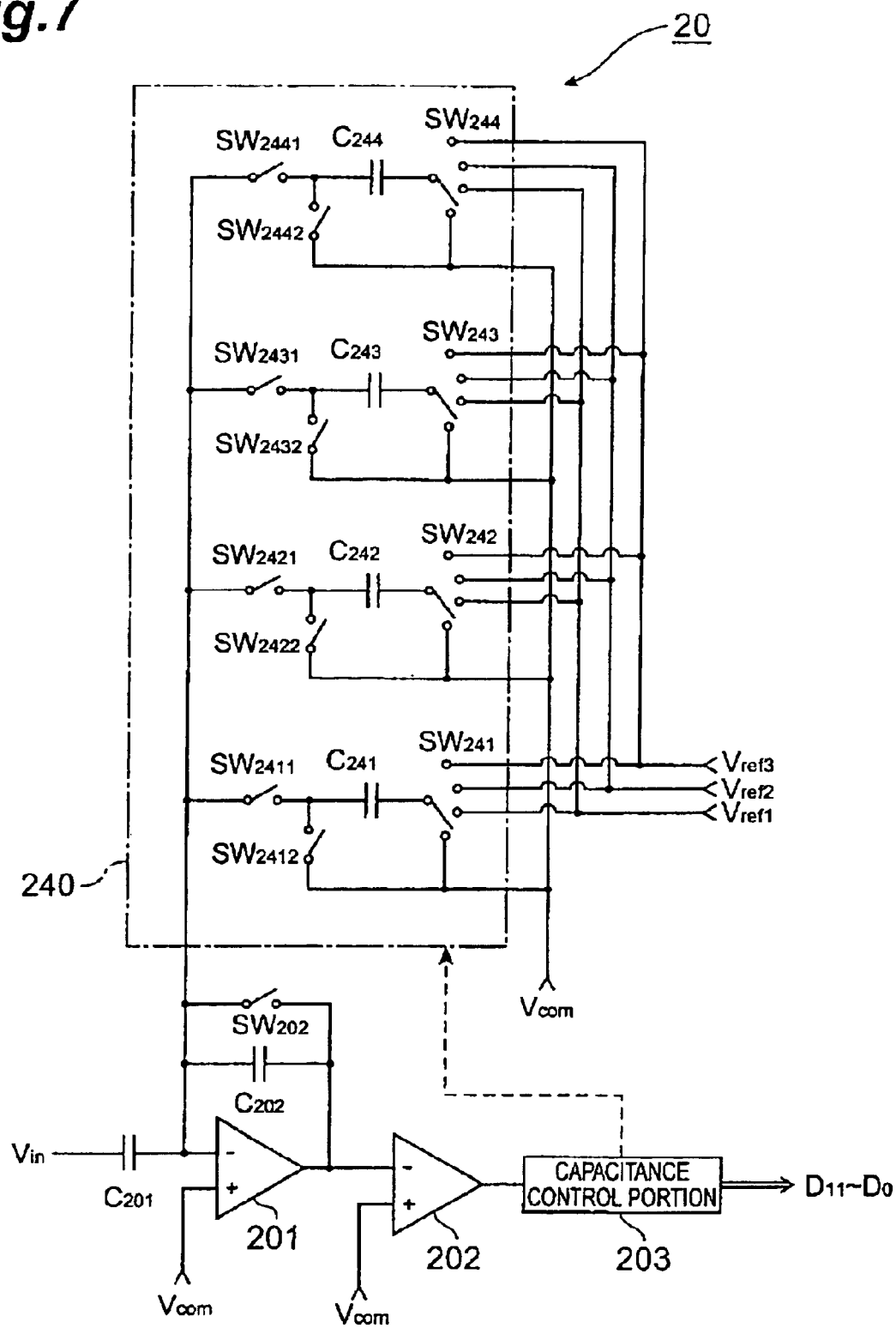
FIG. 7 is a circuit diagram of the A/D conversion circuit 20 of a second embodiment.

FIG. 7 is a circuit diagram of the A/D conversion circuit 20 of the second embodiment. This A/D conversion circuit 20 comprises a coupling capacitor $C_{201}$, feedback capacitor $C_{202}$, switch $SW_{202}$, amplifier 201, comparison portion 202, capacitance control portion 203, and variable capacitance portion 240.

The amplifier 201 inputs the voltage (analog value) output from the integrating circuit 10 to the inverted input terminal via the coupling capacitor $C_{201}$, and inputs the common voltage $V_{com}$ to the non-inverted input terminal. The feedback capacitor $C_{202}$ is provided between the inverted input terminal and the output terminal of the amplifier 201, and integrates charge according to the input voltage. The switch $SW_{202}$ is provided between the inverted input terminal and the output terminal of the amplifier 201, and when open causes charge to be integrated in the feedback capacitor $C_{202}$, but when closed resets the charge integration in the feedback capacitor $C_{202}$. The amplifier 201 outputs a voltage corresponding to the charge amount integrated in the feedback capacitor $C_{202}$ from the output terminal to the comparison portion 202. The comparison portion 202 inputs the voltage output from the amplifier 201 to the inverted input terminal, inputs the common voltage $V_{com}$ to the non-inverted input terminal, compares the magnitudes of these two input signals, and outputs a signal indicating the comparison result to the capacitance control portion 203.

The capacitance control portion 240 comprises, in addition to four capacitors $C_{241}$ to $C_{244}$ and four switches $SW_{241}$ to $SW_{244}$ (voltage switching means), the switches $SW_{2411}$, $SW_{2412}$, $SW_{2421}$, $SW_{2422}$, $SW_{2431}$, $SW_{2432}$, $SW_{2441}$, and $SW_{2442}$. One end of the capacitor $C_{241}$ is connected to the inverted input terminal of the amplifier 201 via the switch $SW_{2411}$, and this end is set to the common voltage $V_{com}$ via the switch $SW_{2412}$; the other end is connected, via the switch $SW_{241}$, to one of the reference voltages $V_{ref1}$, $V_{ref2}$ or $V_{ref3}$, or to the common voltage $V_{com}$. One end of the capacitor $C_{242}$ is connected to the inverted input terminal of the amplifier 201 via the switch $SW_{2421}$, and this end is set to the common voltage $V_{com}$ via the switch $SW_{2422}$; the other end is connected, via the switch $SW_{242}$, to one of the reference voltages $V_{ref1}$, $V_{ref2}$ or $V_{ref3}$, or to the common voltage $V_{com}$. One end of the capacitor $C_{243}$ is connected to the inverted input terminal of the amplifier 201 via the switch $SW_{2431}$, and this end is set to the common voltage $V_{com}$ via the switch $SW_{2432}$; the other end is connected, via the switch $SW_{243}$, to one of the reference voltages $V_{ref1}$, $V_{ref2}$ or $V_{ref3}$, or to the common voltage $V_{com}$. And, one end of the capacitor $C_{244}$ is connected to the inverted input terminal of the amplifier 201 via the switch $SW_{2441}$, and this end is set to the common voltage $V_{com}$ via the switch $SW_{2442}$; the other end is connected, via the switch $SW_{244}$, to one of the reference voltages $V_{ref1}$, $V_{ref2}$ or $V_{ref3}$, or to the common voltage $V_{com}$.

The capacitance values of each of the capacitors, the coupling capacitor $C_{201}$, and the feedback capacitor $C_{202}$ comprised by the variable capacitance portion 240 satisfy the following relations.

$$C_{201} = C_{202} = 16c \tag{17a}$$

$$C_{241} = 8C \tag{17b}$$

$$C_{242} = 4C \tag{17c}$$

$$C_{243} = 2C \tag{17d}$$

$$C_{244} = C \tag{17e}$$

Here C is a certain constant capacitance value. Also, the reference voltages $V_{ref1}$, $V_{ref2}$ and $V_{ref3}$ as well as the common voltage $V_{com}$ supplied to the variable capacitance portion 240 satisfy eq. (2). Because the common voltage $V_{com}$ is generally taken to be ground potential, hereafter it is assumed that $V_{com}=0$. The reference voltages $V_{ref1}$, $V_{ref2}$ and $V_{ref3}$ are each supplied by the reference voltage supply circuit 30.

The capacitance control portion 203 controls the switching operation of each of the switches $SW_{241}$ to $SW_{244}$. The capacitance control portion 203 stores the switched states of these four switches, and outputs a 12-bit digital value ($D_{11}$ to $D_0$) based on these switched states and on a signal output from the comparison portion 202.

Next, the operation of the A/D conversion circuit 20 of the second embodiment is explained. In the first stage of A/D conversion processing, the switch $SW_{202}$ is closed, and the feedback capacitor $C_{202}$ is discharged. Each of the switches $SW_{241}$ to $SW_{244}$ is switched to the common voltage $V_{com}$. The switches $SW_{2411}$, $SW_{2421}$, $SW_{2431}$ and $SW_{2441}$, are all closed; the switches $SW_{2412}$, $SW_{2422}$, $SW_{2432}$, and $SW_{2442}$ are all open. The switch $SW_{202}$ is then opened, and a charge amount Q corresponding to the voltage $V_{in}$ output from the integrating circuit 10 integrates in the feedback capacitor $C_{202}$. Here the charge amount Q is expressed by eq. (4). After this, the actual A/D conversion processing is initiated.

In the second stage of A/D conversion processing, the four switches $SW_{241}$ to $SW_{244}$ comprised by the variable capacitance portion 240 are each switched between the reference voltage $V_{ref1}$ and the common voltage $V_{com}$. This switching operation is similar to that of the second stage in the first embodiment. When this second stage processing ends, the switched states of each of the four switches $SW_{241}$ to $SW_{244}$ comprised by the variable capacitance portion 240 (between either the reference voltage $V_{ref1}$ or the common voltage $V_{com}$) are determined in succession, and the values of the bits $D_{11}$ to $D_8$ are determined in succession. The relations between the voltage $V_{in}$ input to the A/D conversion circuit 20 and the values of the four bits $D_{11}$ to $D_8$ are similar to those indicated in FIG. 4. At the time at which the values of these four bits $D_{11}$ to $D_8$ are determined, the charge amount $Q_1$ remaining in the feedback capacitor $C_{202}$ is equal to or less than $C \cdot V_{ref1}$, and the voltage $V_1$ output from the amplifier 201 is equal to or less than $V_{ref1}/24$, which is a residue insufficient for A/D conversion in the above-described second stage.

Following the above-described second-stage A/D conversion processing, the switches $SW_{2411}$, $SW_{2421}$, $SW_{2431}$ and $SW_{2441}$, are each opened, the switches $SW_{2412}$, $SW_{2422}$, $SW_{2432}$ and $SW_{2442}$ are each closed, the switches $SW_{241}$ to $SW_{244}$ are each switched to the common voltage $V_{com}$, and the capacitors $C_{221}$ to $C_{224}$ are each discharged. Then the switches $SW_{2412}$, $SW_{2422}$, $SW_{2432}$ and $SW_{2442}$ are each opened, and the switches $SW_{2411}$, $SW_{2421}$, $SW_{2431}$ and $SW_{2441}$ are each closed. Following this, the third stage of A/D conversion processing is initiated.

In the third stage of A/D conversion processing, the charge amount $Q_1$ remaining in the feedback capacitor $C_{202}$ at the time the second-stage processing ends is subjected to switching operations of the four switches $SW_{241}$ to $SW_{244}$ comprised by the variable capacitance portion 240 between the reference voltage $V_{ref2}$ and the common voltage $V_{com}$. This switching operation is similar to that of the third stage in the first embodiment. Then, when the third-stage processing is completed, the switched states (to either the reference voltage $V_{ref2}$ or to the common voltage $V_{com}$) of each of the four switches $SW_{241}$ to $SW_{244}$ comprised by the variable capacitance portion 240 are determined in succession, and the values of the bits $D_7$ to $D_4$ are determined in succession. The relations between the voltage $V_1$ and the values of the four bits $D_7$ to $D_4$ are similar to those indicated in FIG. 5. When the values of these four bits $D_7$ to $D_4$ are determined, the charge amount $Q_2$ remaining in the feedback capacitor $C_{202}$ is equal to or less than $C \cdot V_{ref2}$, and the voltage $V_2$ output from the amplifier 201 is equal to or less than $V_{ref2}/2^4$, which is a residue insufficient for A/D conversion in the above-described third stage.

Following the above-described third-stage A/D conversion processing, the switches $SW_{2411}$, $SW_{2421}$, $SW_{2431}$ and $SW_{2441}$ are each opened, the switches $SW_{2412}$, $SW_{2422}$, $SW_{2432}$ and $SW_{2442}$ are each closed, the switches $SW_{241}$ to $SW_{244}$ are each switched to the common voltage $V_{com}$, and the capacitors $C_{221}$ to $C_{224}$ are each discharged. Then the switches $SW_{2412}$, $SW_{2422}$, $SW_{2432}$ and $SW_{2442}$ are each opened, and the switches $SW_{2411}$, $SW_{2421}$, $SW_{2431}$ and $SW_{2441}$, are each closed. Following this, the fourth stage of A/D conversion processing is initiated.

In the fourth stage of A/D conversion processing, the charge amount $Q_2$ remaining in the feedback capacitor $C_{202}$ at the time the third-stage processing ends is subjected to switching operations of the four switches $SW_{241}$ to $SW_{244}$ comprised by the variable capacitance portion 240 between the reference voltage $V_{ref3}$ and the common voltage $V_{com}$. This switching operation is similar to that of the fourth stage in the first embodiment. Then, when the fourth-stage processing is completed, the switched states (to either the reference voltage $V_{ref3}$ or to the common voltage $V_{com}$) of each of the four switches $SW_{241}$ to $SW_{244}$ comprised by the variable capacitance portion 240 are determined in succession, and the values of the bits $D_3$ to $D_0$ are determined in succession. The relations between the voltage $V_2$ and the values of the four bits $D_3$ to $D_0$ are similar to those indicated in FIG. 6. When the values of these four bits $D_3$ to $D_0$ are determined, the charge amount $Q_3$ remaining in the feedback capacitor $C_{202}$ is equal to or less than $C \cdot V_{ref3}$, and the voltage $V_3$ output from the amplifier 201 is equal to or less than $V_{ref3}/2^4$, which is a residue insufficient for A/D conversion even in the above-described third-stage.

At the time the above-described fourth stage of A/D conversion processing ends, a 12-bit digital value $D_{11}$ to $D_0$ corresponding to the switched states of the 4 switches $SW_{241}$ to $SW_{244}$ for the cases of each of the three reference voltages $V_{ref1}$ to $V_{ref3}$ are stored in the capacitance control portion 203. After the fourth-stage processing ends, the 12 bits of digital values $D_{11}$ to $D_0$ are output from the capacitance control portion 203.

In this A/D conversion circuit 20, the area occupied on the chip by all of the capacitors and feedback capacitor portion $C_{202}$ comprised by the variable capacitance portion 240 are equivalent to the area occupied by a capacitor with the capacitance value 31C (=8C+4C+2C+C+16C). On the other hand, in a conventional A/D conversion circuit which outputs 12-bit digital values, the area occupied by the 12 capacitors is equivalent to the area occupied by one capacitor with a capacitance of $2^{12}C$. Thus the area occupied by capacitors in an A/D conversion circuit 20 of this invention is only 1/132 that of a device of the prior art, and only ½ the area occupied by the capacitors in the first embodiment.

(Third Embodiment)

Figure 8:
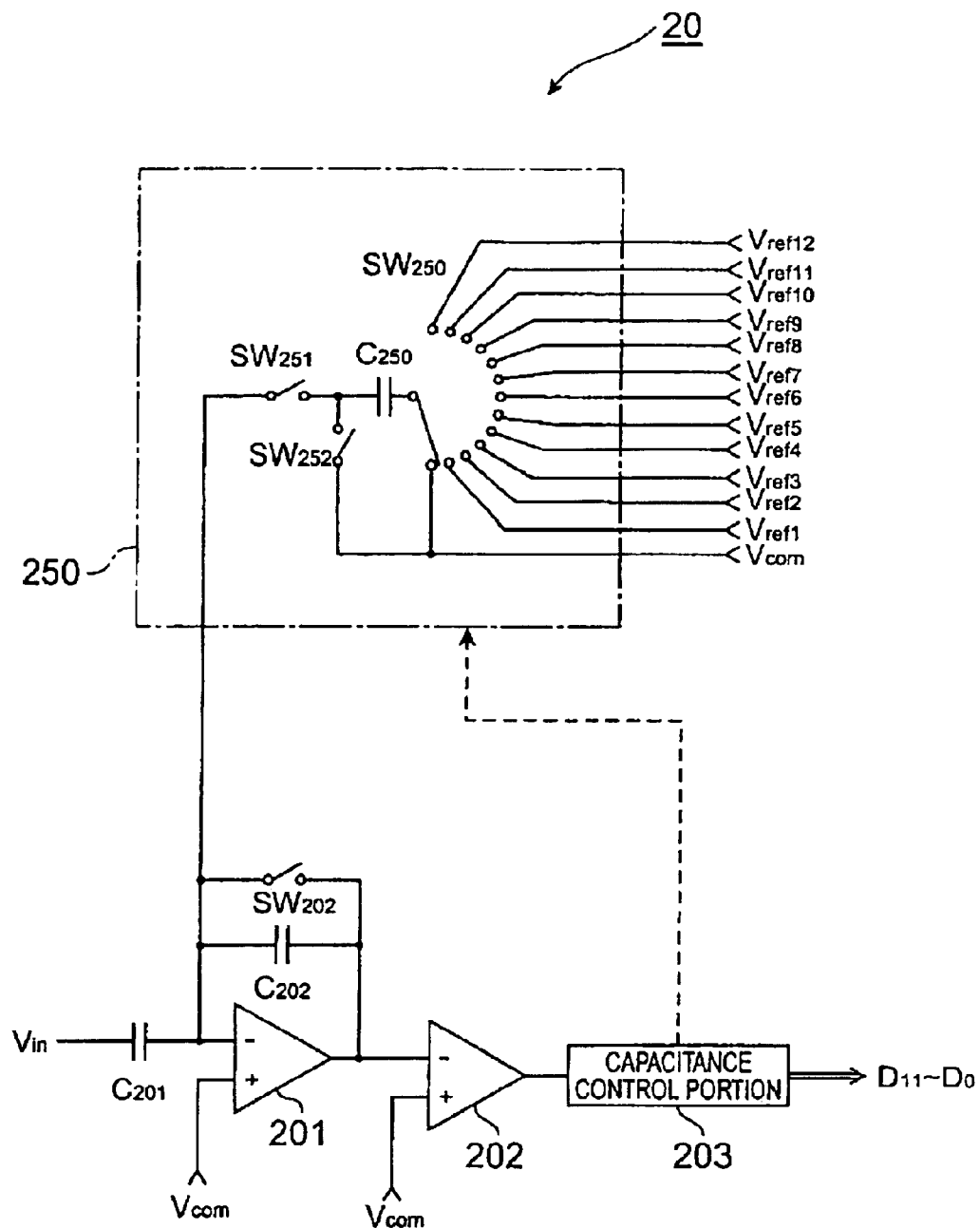
FIG. 8 is a circuit diagram of the A/D conversion circuit 20 of a third embodiment; and, FIG. 9 is a circuit diagram of a reference voltage generation circuit.

Next, a third embodiment of this invention is explained. Compared with the first embodiment, the configurations of both the A/D conversion circuit 20 and the reference voltage supply circuit 30 of the solid-state image pickup device of the third embodiment are different. FIG. 8 is a circuit diagram of the A/D conversion circuit 20 of the third embodiment. This A/D conversion circuit 20 comprises a coupling capacitor $C_{201}$, feedback capacitor $C_{202}$, switch $SW_{202}$, amplifier 201, comparison portion 202, capacitance control portion 203, and variable capacitance portion 250.

The amplifier 201 inputs the voltage (analog value) output from the integrating circuit 10 into the inverted input terminal via the coupling capacitor $C_{201}$, and inputs the common voltage $V_{com}$ to the non-inverted input terminal. The feedback capacitor $C_{202}$ is provided between the inverted input terminal and the output terminal of the amplifier 201, and integrates charge according to the input voltage. The switch $SW_{202}$ is provided between the inverted input terminal and the output terminal of the amplifier 201, and when open causes charge to integrate in the feedback capacitor $C_{202}$, but when closed resets the charge integration in the feedback capacitor $C_{202}$. The amplifier 201 outputs a voltage corresponding to the charge amount integrated in the feedback capacitor $C_{202}$ from the output terminal to the comparison portion 202. The comparison circuit 202 inputs the voltage output from the amplifier 201 to the inverted input terminal, inputs the common voltage $V_{com}$ to the non-inverted input terminal, compares the magnitudes of the two input signals, and outputs a signal indicating the comparison result to the capacitance control portion 203.

The variable capacitance portion 250 comprises, in addition to a capacitor $C_{250}$ and switch $SW_{250}$ (voltage switching means), the switches $SW_{251}$, and $SW_{252}$. One end of the capacitor $C_{250}$ is connected to the inverted input terminal of the amplifier 201 via the switch $SW_{251}$, and the other end is connected, via the switch $SW_{250}$, to either one of the reference voltages $V_{ref1}$ to $V_{ref12}$, or to the common voltage $V_{com}$.

The capacitance values of the capacitor $C_{250}$, coupling capacitor $C_{201}$, and feedback capacitor $C_{202}$ comprised by the variable capacitance portion 250 satisfy the following relations.

$$C_{201}=C_{202}=16C \tag{18a}$$

$$C_{250}=8C \tag{18b}$$

Here C is a certain constant capacitance value. The reference voltages $V_{ref1}$ to $V_{ref12}$ and the common voltage $V_{com}$ satisfy the following relations.

$$V_{ref2}-V_{com}=(V_{ref1}-V_{com})/2 \tag{19a}$$

$$V_{ref3}-V_{com}=(V_{ref2}-V_{com})/2 \tag{19b}$$

$$V_{ref4}-V_{com}=(V_{ref3}-V_{com})/2 \tag{19c}$$

$$V_{ref5}-V_{com}=(V_{ref4}-V_{com})/2 \tag{19d}$$

$$V_{ref6}-V_{com}=(V_{ref5}-V_{com})/2 \tag{19e}$$

$$V_{ref7}-V_{com}=(V_{ref6}-V_{com})/2 \tag{19f}$$

$$V_{ref8}-V_{com}=(V_{ref7}-V_{com})/2 \tag{19g}$$

$$V_{ref9}-V_{com}=(V_{ref8}-V_{com})/2 \tag{19h}$$

$$V_{ref10}-V_{com}=(V_{ref9}-V_{com})/2 \tag{19i}$$

$$V_{ref11}-V_{com}=(V_{ref10}-V_{com})/2 \tag{19j}$$

$$V_{ref12}-V_{com}=(V_{ref11}-V_{com})/2 \tag{19k}$$

Because the common voltage $V_{com}$ is generally taken to be ground potential, hereafter it is assumed that $V_{com}=0$. Also, the reference voltages $V_{ref1}$ to $V_{ref12}$ are each supplied by the reference voltage supply circuit 30. The reference voltage supply circuit 30 is, for example, a voltage-dividing circuit in which resistors are connected in series.

The capacitance control portion 203 controls the switching operation of the switch $SW_{250}$. Also, the capacitance control portion 203 stores the switched state of the switch $SW_{250}$, and outputs a 12-bit digital value ($D_{11}$ to $D_0$) based on this switched state and on a signal output from the comparison portion 202.

Next, the operation in the A/D conversion circuit 20 of the third embodiment is explained. In the first stage of A/D conversion processing, the switch $SW_{202}$ is closed, and the feedback capacitor $C_{202}$ is discharged. The switch $SW_{250}$ is switched to the common voltage $V_{com}$. The switch $SW_{251}$ is closed, and the switch $SW_{252}$ is open. Then, the switch $SW_{202}$ is opened, and a charge amount Q corresponding to the voltage $V_{in}$ output from the integrating circuit 10 integrates in the feedback capacitor $C_{202}$. Here the charge amount Q is expressed by eq. (4). Then, the actual A/D conversion processing is initiated.

In the second stage of A/D conversion processing, switching of the switches $SW_{250}$ comprised by the variable capacitance portion 250 between the reference voltage $V_{ref1}$ and the common voltage $V_{com}$ is performed. That is, the switch $SW_{250}$ is switched to the reference voltage $V_{ref1}$. As a result, of the charge Q integrated in the feedback capacitor $C_{202}$ (eq. (4)), the charge amount $Q_{250}$ expressed by the following equation moves to the capacitor $C_{250}$.

$$Q_{250}=C_{250}\cdot V_{ref1}=8C\cdot V_{ref1} \tag{20}$$

At this time, the charge amount $Q_{202}$ expressed by the following equation remains in the feedback capacitor $C_{202}$.

$$Q_{202} = 16C\cdot V_{in} - 8C\cdot V_{ref1}$$
$$= 16C(V_{in} - V_{ref1}/2) \tag{21}$$

Then, the voltage $(V_{in}-V_{ref1}/2)$ is output from the amplifier 201. The magnitudes of the voltage $(V_{in}-V_{ref1}/2)$ input from the inverted input terminal of the amplifier 201 and the common voltage $V_{com}$ (=0) input from the non-inverted input terminal are compared by the comparison portion 202, and the sign of the voltage $(V_{in}-V_{ref1}/2)$ is judged. The result is input to the capacitance control portion 203, and is stored as the value of the uppermost bit $D_{11}$ for output. That is, if the voltage $(V_{in}-V_{ref1}/2)$ is positive, then $D_{11}$ is set to 1, and otherwise $D_{11}$ is set to 0. When the value of this bit $D_{11}$, is determined, the charge amount $Q_1$ remaining in the feedback capacitor $C_{202}$ is equal to or less than $C\cdot V_{ref1}$, and the voltage $V_1$ output from the amplifier 201 is equal to or less than $V_{ref1}/2$, which is a residue insufficient for A/D conversion in the above-described second stage.

After the above-described second stage of A/D conversion processing, the switch $SW_{251}$ is opened, the switch $SW_{252}$ is closed, the switch $SW_{250}$ is switched to the common voltage $V_{com}$, and the capacitor $C_{250}$ is discharged. Then the switch $SW_{252}$ is opened, and the switch $SW_{251}$ is closed. After this, the third stage of A/D conversion processing is initiated.

In the third stage of A/D conversion processing, the charge amount $Q_1$ remaining in the feedback capacitor $C_{202}$ at the time the second-stage processing ends is subjected to switching operations of the switch $SW_{250}$ comprised by the variable capacitance portion 250 between the reference voltage $V_{ref2}$ and the common voltage $V_{com}$. That is, the switch $SW_{250}$ is switched to the reference voltage $V_{ref2}$. As a result, of the charge $Q_1$ integrated in the feedback capacitor $C_{202}$, the charge amount $Q_{250}$ expressed by the following equation moves to the capacitor $C_{250}$.

$$Q_{250} = C_{250} \cdot V_{ref2} = 4C \cdot V_{ref1} \tag{22}$$

At this time, the charge amount $Q_{202}$ expressed by the following equation remains in the feedback capacitor $C_{202}$.

$$Q_{202} = 16C \cdot V_1 - 4C \cdot V_{ref1} \tag{23}$$
$$= 16C(V_1 - V_{ref1}/2^2)$$

Then, the voltage $(V_1 - V_{ref1}/2^2)$ is output from the amplifier 201. The magnitudes of the voltage $(V_1 - V_{ref1}/2^2)$ input from the inverted input terminal of the amplifier 201 and the common voltage $V_{com}$ (=0) input from the non-inverted input terminal are compared by the comparison portion 202, and the sign of the voltage $(V_1 - V_{ref1}/2^2)$ is judged. The result is input to the capacitance control portion 203, and is stored as the value of the bit $D_{10}$ for output. That is, if the voltage $(V_1 - V_{ref1}/2^2)$ is positive, then $D_{10}$ is set to 1, and otherwise $D_{10}$ is set to 0. When the value of this bit $D_{10}$ is determined, the charge amount $Q_2$ remaining in the feedback capacitor $C_{202}$ is equal to or less than $C \cdot V_{ref1}/2$, and the voltage $V_2$ output from the amplifier 201 is equal to or less than $V_{ref1}/2^2$, which is a residue insufficient for A/D conversion in the above-described third stage.

After the above-described third stage of A/D conversion processing, the switch $SW_{251}$ is opened, the switch $SW_{252}$ is closed, the switch $SW_{250}$ is switched to the common voltage $V_{com}$, and the capacitor $C_{250}$ is discharged. Then the switch $SW_{252}$ is opened and the switch $SW_{251}$ is closed. After this, the fourth stage of A/D conversion processing is initiated.

In the fourth stage of A/D conversion processing, the charge amount $Q_2$ remaining in the feedback capacitor $C_{202}$ at the time the third-stage processing ends is subjected to switching operations of the switch $SW_{250}$ comprised by the variable capacitance portion 250 between the reference voltage $V_{ref3}$ and the common voltage $V_{com}$. That is, the switch $SW_{250}$ is switched to the reference voltage $V_{ref3}$. As a result, of the charge $Q_2$ integrated in the feedback capacitor $C_{202}$, the charge amount $Q_{250}$ expressed by the following equation moves to the capacitor $C_{250}$.

$$Q_{250} = C_{250} \cdot V_{ref3} = 2C \cdot V_{ref1} \tag{24}$$

At this time, the charge amount $Q_{202}$ expressed by the following equation remains in the feedback capacitor $C_{202}$.

$$Q_{202} = 16C \cdot V_1 - 2C \cdot V_{ref1} \tag{25}$$
$$= 16C(V_1 - V_{ref1}/2^3)$$

Then, the voltage $(V_2 - V_{ref1}/2^3)$ is output from the amplifier 201. The magnitudes of the voltage $(V_2 - V_{ref1}/2^3)$ input from the inverted input terminal of the amplifier 201 and the common voltage $V_{com}$ (=0) input from the non-inverted input terminal are compared by the comparison portion 202, and the sign of the voltage $(V_2 - V_{ref1}/2^3)$ is judged. The result is input to the capacitance control portion 203, and is stored as the value of the bit $D_9$ for output. That is, if the voltage $(V_2 - V_{ref1}/2^3)$ is positive, then $D_9$ is set to 1, and otherwise $D_9$ is set to 0. When the value of this bit $D_9$ is determined, the charge amount $Q_3$ remaining in the feedback capacitor $C_{202}$ is equal to or less than $C \cdot V_{ref1}/2^2$, and the voltage $V_3$ output from the amplifier 201 is equal to or less than $V_{ref1}/2^3$, which is a residue insufficient for A/D conversion in the above-described fourth stage.

After the above-described fourth stage of A/D conversion processing, the switch $SW_{251}$ is opened, the switch $SW_{252}$ is closed, the switch $SW_{250}$ is switched to the common voltage $V_{com}$, and the capacitor $C_{250}$ is discharged. Then the switch $SW_{252}$ is opened and the switch $SW_{251}$ is closed. After this, the fifth stage of A/D conversion processing is initiated.

The fifth and subsequent stages of A/D conversion processing are similar. In the 13th stage of A/D conversion processing, the charge amount remaining in the feedback capacitor $C_{202}$ at the end of the 12th stage of processing is subjected to switching of the switch $SW_{250}$ comprised by the variable capacitance portion 250 between the reference voltage $V_{ref12}$ and the common voltage $V_{com}$. In this 13th stage, the value of the lowermost bit $D_0$ is stored in the capacitance control portion 203.

When the above-described 13th stage of A/D conversion processing ends, a 12-bit digital value $D_{11}$ to $D_0$, corresponding to the switched states of the switch $SW_{250}$ in each of the cases of the 12 levels of reference voltages $V_{ref1}$ to $V_{ref12}$, is stored in the capacitance control portion 203. After the end of the 13th stage of processing, this 12-bit digital value $D_{11}$ to $D_0$ is output from the capacitance control portion 203.

In this A/D conversion circuit 20, the area occupied on the chip by all of the capacitors and the feedback capacitor $C_{202}$ comprised by the variable capacitance portion 240 is equivalent to the area occupied by one capacitor with capacitance value 24C (=8C+16C). On the other hand, in a conventional A/D conversion circuit which outputs 12-bit digital values, the area occupied by the 12 capacitors is equivalent to the area occupied by one capacitor with a capacitance value of $2^{12}C$. Thus the area occupied by capacitors in the A/D conversion circuit 20 of this embodiment is $1/170$ that of the prior art, and is $2/5$ the area occupied by capacitors in the first embodiment.

(Modified Embodiment)

In general, the number M of variable capacitance portions comprised by an A/D conversion circuit of this invention is 1 or greater, the number $N_m$ of capacitors comprised by the mth variable capacitance portion ($1 \leq m \leq M$) among the M variable capacitance portions is 1 or greater, and the number of levels of reference voltages $P_m$ input to the other end (on the side opposite the end connected to the input terminal of the amplifier) of the respective $N_m$ capacitors comprised by the mth variable capacitance portion is 1 or greater. However, the case of $M=P_1=1$ is excluded. If the capacitance values of the $N_m$ capacitors comprised by the mth variable capacitance portion are $C_{m,1}$ to $C_{m,Nm}$, and the reference voltages supplied to the mth variable capacitance portion are $V_{ref,m,1}$ to $V_{ref,m,Pm}$, then for each m value, each n value ($1 \leq n \leq N_m$), and each p value ($1 \leq p \leq P_m$), values are chosen such that each value of $C_{m,n} \cdot V_{ref,m,p}$ is different. Further, it is preferable that each value of $C_{m,n} \cdot V_{ref,m,p}$, when arranged in an ascending series, constitute a geometric progression the common ratio of which is 2. The number of bits of the digital value output from the A/D conversion circuit is expressed by the following equation.

$$N_1 \cdot P_1 + N_2 \cdot P_2 + \ldots + N_M \cdot P_M \tag{26}$$

In each of the above embodiments, the number of bits of the digital value output from the A/D conversion circuit was 12; but any arbitrary number may be used. In the above-described first embodiment, $M=3$, $N_m=4$ for each, and $P_m=1$ for each; but in general, M may be an arbitrary number equal to or greater than 2, and each $N_m$ may also be an arbitrary number each to or greater than 2. In the above-described second embodiment, $M=1$, $N_1=4$, and $P_1=3$; but in general, $N_1$ may be an arbitrary number equal to or greater than 2, and $P_1$ may also be an arbitrary number equal to or greater than 2. In this case, the area occupied on the chip by the $N_1$ capacitors is smaller still. In the above-described third embodiment, $M=1$, $N_1=1$, and $P_1=12$; but in general, $P_1$ may be an arbitrary number equal to or greater than 2, and in this case the area occupied on the chip by the single capacitor is smaller still. Further, M may be greater than 1, and for each value of $N_m$ may be 1 and $P_m$ may be 1. M may be greater than 1, each value of $N_m$ may differ, and each value of $P_m$ may differ as well.

Figure 9:
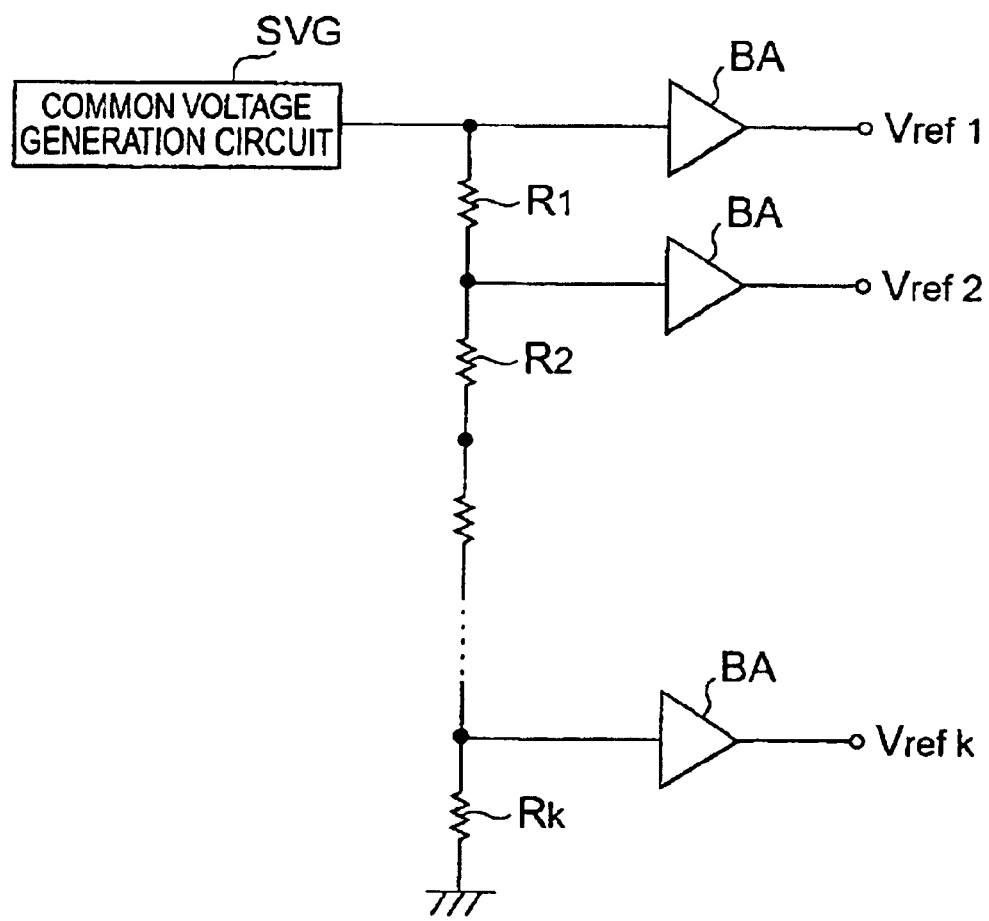

FIG. 9 is a circuit diagram of a reference voltage generation circuit which generates the above-described reference voltages $V_{refk}$ (k=1,2,3, . . . ). The voltage of the common voltage generation circuit SVG is divided into multiple values by series resistors (R1, R2, . . . , Rk). Each of the divided voltage outputs is captured as a reference voltage $V_{refk}$ via a buffer amplifier BA.

Industrial Applicability

This invention can be utilized in an A/D conversion circuit which converts analog values into digital values, and in a solid-state image pickup device comprising this A/D conversion circuit.

What is claimed is:

1. An A/D conversion circuit, which converts an analog value input at the input end into a digital value and outputs the digital value at the output end, comprising:

an amplifier having a first input terminal, second input terminal, and output terminal, said first input terminal of which is connected to said input end via a coupling capacitor, and to said second input terminal of which is input a common voltage $V_{com}$;

a feedback capacitor, provided between said first input terminal and said output terminal of said amplifier;

a switch, provided between said first input terminal and said output terminal of said amplifier;

a number M of variable capacitance portions, each having a number $N_m$ of capacitance elements one end of each of which is connected to said first input terminal of said amplifier and having different capacitance values, and voltage switching means which switches a voltage for input to the other end of the respective said $N_m$ capacitors, between said common voltage $V_{com}$ and any of a number $P_m$ of reference voltages $V_{ref,m,1}$ to $V_{ref,m,Pm}$, wherein $M \geq 1$, $N_m \geq 1$, $P_m \geq 1$, $1 \leq m \leq M$, but excluding the case $M=P_1=1$;

a comparison portion, which compares the magnitudes of the voltage output from said output terminal of said amplifier and said common voltage $V_{com}$, and outputs a signal indicating the comparison result; and, a capacitance control portion, which controls the switching operations of each of said voltage switching means of said M variable capacitance portions, and which outputs to said output end a digital value based on the switched states of each of said voltage switching means of said M variable capacitance portions as well as on the signal output from said comparison portion.

2. The A/D conversion circuit according to claim 1, wherein M is 1, and $N_1$ and $P_1$ are each 2 or more.

3. The A/D conversion circuit according to claim 1, wherein M and $N_1$ are each 1, and $P_1$ is 2 or more.

4. A solid-state image pickup device, comprising:

a photodetector element, which outputs a signal current corresponding to the incident light intensity;

an integrating circuit, which inputs and integrates the signal current output by said photodetector element, and outputs a voltage corresponding to the integrated value of the signal current; and, the A/D conversion circuit according to claim 1, which inputs the voltage output by said integrating circuit, and converts the voltage to a digital value.

\* \* \* \* \*